United States Patent [19]
Fine et al.

[11] Patent Number: 5,464,666
[45] Date of Patent: Nov. 7, 1995

[54] PROCESS FOR CHEMICAL VAPOR CODEPOSITION OF COPPER AND ALUMINUM ALLOYS

[75] Inventors: Stephen M. Fine; David A. Bohling, both of Emmaus, Pa.

[73] Assignee: Air Products and Chemicals, Inc., Allentown, Pa.

[21] Appl. No.: 384,088

[22] Filed: Feb. 6, 1995

[51] Int. Cl.⁶ ............................................. B05D 3/06
[52] U.S. Cl. .................. 427/576; 427/252; 427/255.2; 427/314; 427/585
[58] Field of Search ............................. 427/576, 585, 427/252, 255.2, 314

[56] References Cited

U.S. PATENT DOCUMENTS

| | | | |
|---|---|---|---|
| 4,923,717 | 5/1990 | Gladfelter et al. | 427/252 |
| 5,085,731 | 2/1992 | Norman et al. | 156/646 |
| 5,098,516 | 3/1992 | Norman et al. | 156/666 |
| 5,191,099 | 3/1993 | Gladfelter et al. | 556/27 |
| 5,273,775 | 12/1993 | Dyer et al. | 427/99 |

OTHER PUBLICATIONS

K. P. Cheung, et al. in *Proceedings of the Int'l VLSI Multilevel Interconnection, Conf.* (IEEEW, 1990), p. 303 (no month available).

L. F. Tz. Kwakman, et al. ibid., p. 282 (no date available).

Fine, et al. *Chemical Perspectives of Microelectronic Materials II*, (Mater. Res. Soc. Proc. 204, Pittsburgh, Pa., 1990) pp. 415–420 (no month available).

V. H. Houlding et al. (*Materials Res. Society Proceedings* 260, Pittsburgh, Pa. 1992) pp. 119–124 (no month avail.).

T. Katagiri, et al. *Jpn. J. Appl. Phys.*, 32, L1078, (1993) (no month avail.).

E. Kondoh, et al., *J. Electrochem. Soc.*, 141, 3494, (1994) (no month avail.).

H. Bürger, et al. *Monatsh.*, 95, 1099, (1964) (no month avail.).

S. G. McGeachin, *Can. J. Chem.*, 46, 1903, (1968) (no month avail.).

C. Oehr, et al. Appl. Phys. A45 151 (1988) (no month avail.).

*Primary Examiner*—Bernard Pianalto
*Attorney, Agent, or Firm*—Geoffrey L. Chase

[57] ABSTRACT

The present invention is a method for the simultaneous codeposition of copper and aluminum from volatile copper and aluminum precursors to form a layer on a substrate under chemical vapor phase conditions, such as the metallization of an aluminum/(0.25–4% copper) layer on a silicon semiconductor electronic device.

15 Claims, No Drawings

PROCESS FOR CHEMICAL VAPOR CODEPOSITION OF COPPER AND ALUMINUM ALLOYS

TECHNICAL FIELD OF THE INVENTION

The present invention is directed to the simultaneous chemical vapor codeposition of copper and aluminum alloys on a semiconductor substrate for metallization using the appropriate selection of volatile, compatible copper and aluminum precursor sources in combination.

BACKGROUND OF THE INVENTION

Aluminum/0.25–4% copper alloys have become the metallization of choice for very large scale integrated circuits (VLSI). The most common methods for depositing the alloy are magnetron sputtering or other physical vapor deposition (PVD) techniques. However, as the feature size of ultralarge scale integrated circuits (ULSI) continues to decrease to the sub-0.5 μm regime, it becomes increasingly difficult to successfully use PVD metallization. PVD is largely a line-of-sight technique and has difficulty conformally coating <0.5 μm high aspect ratio features. This limitation of PVD has created a growing interest in chemical vapor deposition (CVD) techniques. CVD is an inherently conformal process and excellent step coverage is possible. Also, since CVD can be catalyzed by portions of the substrate surface, selective deposition is also possible.

State-of-the-art integrated circuits, such as Intel's 586 (i.e. Pentium™) processor, uses CVD tungsten for filling vias because of inadequate step coverage with PVD techniques. However, CVD tungsten, while having excellent step coverage, has a much higher resistivity than Al/(0.25–4% Cu) (10–15 vs. 3 μΩ -cm, respectively). The resistivity of the CVD tungsten metallization can limit the clock speed of the device due to the RC-time delay. This effect becomes more important as the minimum feature size of integrated circuits continues to decrease and the clock speed continues to increase. Thus, for future generations of integrated circuits, high resistivity CVD tungsten will have to be replaced with a lower resistivity CVD metal, such as Al/(0.25–4% Cu) alloy. However, currently, there is no good process for depositing Al/(0.25–4% Cu) by CVD codeposition.

There exists a need in the electronics industry for a new process for depositing Al/(0.25–4% Cu) alloy metallization by CVD co-deposition. Sputtered Al/(0.25–4% Cu) is used for metal runners. The metal runners are not high aspect ratio features and sputtering gives adequate step coverage. The advantages of using CVD Al/(0.25–4% Cu) for via fills instead of CVD tungsten are, the same alloy is used for all metallization steps, and CVD Al/(0.25–4% Cu) has a very low resistivity. Using the same alloy for all metallization steps should dramatically simplify processing. The advantages are numerous; there would be no need for diffusion barriers and adhesion promoters between the via fill and the runners, thus reducing cost; aluminum based alloys are easily etched to define the circuit lines; Al/(0.25–4% Cu) has a much lower resistivity than CVD tungsten, therefore a much lower RC-time delay constant.

Dimethylethylaminealane, DMEAAl, has previously been shown to be the most effective available precursor for the chemical vapor deposition of pure aluminum metallization at temperature greater than about 150° C. The compound has been described in U.S. Pat. No. 5,191,099. Trimethylaminealane (TMAAl) has also been used effectively to deposit high quality aluminum, as described in U.S. Pat. No. 4,923,717. However, to date, the utility of the DMEAAl precursor has been limited by the lack of a suitable precursor and process to co-deposit copper with DMEAAl. While the CVD of pure aluminum has been known for many years, pure aluminum does not have sufficient electromigration resistance to be useful for ULSI interconnects. Therefore, there is a need in the electronics industry for a process to co-deposit copper and aluminum using DMEAAl and a volatile copper precursor. The difficulty in developing a Cu/Al codeposition process is that the requirements for an appropriate copper precursor are very stringent. The copper precursor must be:

1. Sufficiently volatile at <100° C.
2. Thermally stable at room temperature for extended periods of time.
3. Chemically compatible with DMEAAl, as well as other available aluminum precursors.
4. Not suffer from parasitic pre-reactions with DMEAAl or the aluminum precursor of choice.
5. Not contain oxygen, fluorine, primary amine hydrogen, or phosphorus. The high reactivity of DMEAAl and other alanes with oxygen and fluorine requires that the copper precursor not contain any of these elements. Phosphorus is a n-type dopant for silicon and is therefore an unacceptable constituent for a CVD precursor. Primary amine hydrogens react with the hydride of the DMEAAl or other alanes forming an aluminum-amide polymeric species.
6. The co-deposition process with DMEAAl or other aluminum precursor must deposit Al/(0.25–4% Cu) which has a uniform composition, low resistivity, smooth morphology, small grain size, and does not contain chemical impurities.

Only recently has research focused on techniques to incorporate copper into aluminum films. Several two step processes have been reported. Kwakman, Cheung and coworkers report copper incorporation into CVD aluminum by sputtering copper onto the substrate either before or after CVD aluminum deposition, see K. P. Cheung, C. J. Case, R. Liu, R. J. Schutz, R. S. Wagner, L. F. Tz. Kwakman, D. Huibregtse, H. W. Piekaar, and E. H. A. Granneman in *Proceedings of the International VLSI Multilevel Interconnection Conference,* (IEEE, 1990), p. 303, and L. F. Tz. Kwakman, D. Huibregtse, H. W. Piekaar, and E. H. A. Granneman, K. P. Cheung, C. J. Case, Y. Lai, R..Liu, R. J. Schutz, R. S. Wagner, ibid., p. 282. Fine et. al. report a two-step consecutive selective deposition using trimethylaminealane (TMAAl) and (hfac)Cu(tmvs) in S. M. Fine, P. N. Dyer, J. A. T. Norman, in *Chemical Perspectives of Microelectronic Materials II,* (Mater. Res. Soc. Proc. 204, Pittsburgh, Pa., 1990) pp.415–420. U.S. Pat. No. 5,273,775 discloses such a process. U.S. Pat. No. 5,085,731 discloses analogous copper ketone compounds and their synthesis. U.S. Pat. No. 5,098,516 describes the use of such compounds to form discrete copper layers or films.

Previous attempts to develop CVD codeposition of aluminum/copper have been unsuccessful due to either incompatibility of the copper and aluminum precursors or thermal incompatibility of the copper precursor (either too reactive or unreactive at useful process temperatures). Houlding et. al. report a copper/aluminum codeposition technique in V. H. Houlding, H. Maxwell, Jr., S. M. Crochiere, D. L. Farrington, R. S. Rai, and J. M. Tartaglia (*Materials Research Society Proceedings* 260, Pittsburgh, Pa. 1992) pp 119–124. However, their process has problems with parasitic prereaction between the copper and aluminum precursors and thermal instability of the copper precursor. Katagiri et. al. report the CVD codeposition of Al/(0.25–4% Cu) alloy by CVD codeposition of dimethylaluminum hydride, DMAH, and (cyclopentadienyl)copper(triethylphosphine), CpCu(PEt₃), see Katagiri, E. Kondoh, N. Takeyasu, and T. Nakano, *Jpn. J. Appl. Phys.*, 32, L1078, (1993) and E. Kondoh, Y. Kawano, N. Takeyasu, and T. Ohta, *J. Electrochem. Soc,*, 141, 3494, (1994). The difficulties with this process are the thermal instability, and presence of phosphorus in CpCu(PEt₃), and the tendency of DMAH to oligomerize into high molecular weight and viscous dimethylaluminum hydride polymers. Formation of these polymers in the DMAH bubbler will cause inconsistent delivery rates for the aluminum precursor. A potentially chemically compatible copper compound, $[Cu[N(SiMe_3)_2]]_4$, is known to be stable to at least 180° C., as reported by Bürger, H., and Wannagut, U., Monatsh., 95, 1099 (1964), making it unacceptable for low temperature CVD applications.

A class of copper β-diketimine compounds $(Cu(BDI)_2)$ have been reported in the literature, S. G. McGeachin, *Can. J. Chem.*, 46, 1903, (1968), but a utility for their use in accordance with the present invention was not contemplated for them.

The drawbacks of the prior art of multiple film formation steps, precursor compounds which are difficult to handle, and temperatures of film forming which are inappropriately high are overcome by the present invention as set forth below.

BRIEF SUMMARY OF THE INVENTION

The present invention is a new method that solves the problems in codeposition of copper and aluminum for metallization. A class of copper β-diketimine compounds $(Cu(BDI)_2)$ are identified as copper precursors for codeposition with an aluminum precursor, which copper compounds have not been previously used for chemical vapor deposition with aluminum precursors. These compounds are volatile solids which decompose into copper at temperatures greater than about 150° C. These compounds have the molecular formula shown below.

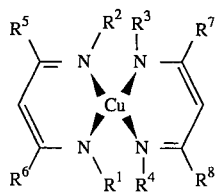

where $R^1$, $R^2$, $R^3$, $R^4$, $R^5$, $R^6$, $R^7$, $R^8$ are individually= H, CH₃ (Me), CH₂CH₃ (Et), CH₂CH₂CH₃ (Pr), CH₂CH₂CH₂CH₃ (Bu), Phenyl, or any C₁–C₁₀ hydrocarbon which does not contain oxygen, fluorine, or phosphorus. Most preferably, $R^1$–$R^4$= H, Me, Et, or Pr, and $R^5$–$R^8$= Me. These compounds have the greatest volatility in this class, are thermally stable for extended periods of time at room temperature, and decompose in the presence of hydrogen at temperature greater than about 150° C. to deposit copper.

A class of alkylaminealane compounds are identified as the aluminum precursors for the codeposition with the copper precursor, which alkylaminealane compounds have also not been previously used for chemical vapor deposition with copper precursors. The alkylaminealanes have the molecular formula: $H_3AlN(R^9)(R^{10})(R^{11})$, where $R^9$, $R^{10}$ and $R^{11}$ are individually C₁–C₄ and at least one of the R groups can be CH₂CH₂N(CH₃)₂.

The chemistry of the copper precursors is well suited for CVD codeposition with the aluminum precursor compounds, such as alkylaminealanes, because it will react with the alkylaminealanes, such as dimethylethylaminealane, at temperatures greater than 150° C. to deposit Al/Cu alloy according to the following reaction.

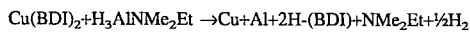

Dimethylethylaminealane (DMEAAl) is a strong reducing agent and will be very effective at reducing the Cu(II) at temperatures above 150° C. The CVD process could be performed in a number of modes, low pressure CVD, atmospheric pressure CVD, or plasma enhanced CVD. These CVD methods are all well known in the art. In low pressure CVD (LPCVD), and atmospheric pressure CVD, (APCVD), the substrate onto which the metal film is to be deposited is heated to the deposition temperature. The precursors are transported, in the gas phase, to the surface of the substrate. The precursors then thermally decompose to deposit the desired metal alloy onto the substrate. In plasma enhanced CVD, the thermal decomposition is activated by the presence of a plasma discharge. Typically, the wafer pedestal is one of the electrodes of a parallel plate rf-plasma reactor. The rf frequency is typically 100 KHz to 13.56 MHz, although any frequency which actively supports a plasma would be sufficient. Other configurations supporting the discharge are also well known. Using plasma enhancement allows films to be deposited at lower temperatures than is possible with thermal activation alone. For example, see C. Oehr and H. Suha Appl. Phys. A45 151 (1988).

DETAILED DESCRIPTION OF THE INVENTION

The present invention provides a unique method for codeposition of aluminum and copper as an alloy in a single reaction or step and at reasonable temperatures and traditional chemical vapor deposition conditions to provide a film or layer of the aluminum and copper alloy on a substrate, such as a semiconductor substrate including silicon, silicon oxide, gallium arsenide, silicon nitride, or nonsemiconductor substrates such as cloth, paper, tungsten, glass, tin oxide, polyimide, polymethylmethacrylate, graphite, ceramic, as well as other substrates upon which a metallization layer or film is desired.

A class of copper β-diketimine compounds $(Cu(BDI)_2)$ are utilized for the first time as copper precursors for codeposition with an aluminum precursor, which copper compounds have not been previously used for chemical vapor deposition with aluminum precursors. These compounds are volatile solids which decompose into copper at temperatures greater than about 150° C. These compounds have the molecular formula shown below.

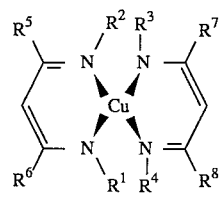

where $R^1$, $R^2$, $R^3$, $R^4$, $R^5$, $R^6$, $R^7$, $R^8$ are individually= H, CH₃ (Me), CH₂CH₃ (Et), CH₂CH₂CH₃ (Pr), CH₂CH₂CH₂CH₃ (Bu), Phenyl, or any C₁–C₁₀ hydrocarbon which does not contain oxygen, fluorine, or phosphorus. The R groups are individually chosen from the groups listed above and the R groups can be in the iso- or tertiary- format where appropriate. The $C_1$–$C_{10}$ hydrocarbons can include alkyls, alkenyls, alkynyls, cycloalkyls, cycloalkenyls, alkaryls, aryls and aralkyls. Most preferably, $R^1$–$R^4$= H, Me, Et, or Pr, and $R^5$–$R^8$= Me. These compounds have the greatest volatility in this class, are thermally stable for extended periods of time at room temperature, and decompose in the presence of hydrogen at temperature greater than 150° C. to deposit copper. Preferred copper precursors include: bis(N-N'-dimethyl-4-amino-2-imino-3-pentenyl)copper(II), bis(N-N'-diethyl-4-amino-2-imino-3-pentenyl)copper(II), and bis(4-amino-2-imino -3-pentenyl)copper(II).

The aluminum precursor can be selected from the group consisting of:

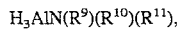

where $R^9$, $R^{10}$ and $R^{11}$ are individually $C_1$–$C_4$ hydrocarbon and at least one of the R groups can be $CH_2CH_2N(CH_3)_2$, or

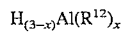

where $R^{12}$ are individually $C_1$–$C_4$ hydrocarbon and x=1–3, or

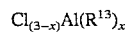

where $R^{13}$ are individually $C_1$–$C_4$ hydrocarbon and x=1– 3.

Preferably, the aluminum precursor is selected from the group consisting of trimethylaminealane, dimethylethylaminealane, dimethylaluminum hydride and mixtures thereof.

The resulting aluminum and copper alloy metallization film or layer can have varying proportions of each metal depending upon the requirements of the application, but a preferred composition for the aluminum and copper alloy is aluminum/(0.25–4% by weight) copper.

The chemical vapor deposition zone or reactor where the aluminum and copper alloy is deposited as a film or layer can be operated at a pressure in the range of approximately 0.10 torr up to atmospheric and slightly above atmospheric pressures. The temperature of the zone or reactor should be high enough to avoid condensation of the precursors or reactants so that they remain in the vapor phase prior to decomposition. This can be achieved by heating the walls of the zone or reactor to above the condensation temperature of the chosen reactants or precursors with the additional temperature of decomposition of those reactants or precursors being supplied by the heating of the substrate to be coated to such temperature, or the entire reactor can be heated to the decomposition temperature of the reactants or precursors. The temperature understandably will vary depending on the condensation temperature and decomposition temperature of the precursors chosen. Typically, the temperature should be above 100° C., and more particularly in the range of 150° C. to 250° C. Alternatively, the chemical vapor deposition zone or reactor can be utilized with a plasma generated by known techniques, such as an RF field where the substrate is one of the electrodes of a parallel set of electrodes and an RF frequency of any operable frequency is used, exemplified by 13.56 MHz at a power of 10–100 watts.

The aluminum and copper precursors can be transported from their respective storage vessels to the chemical vapor deposition by delivery as a liquid to a prevaporization station or zone where the liquid precursor is vaporized for injection into the chemical vapor deposition zone or reactor for decomposition, or the aluminum and copper precursors can be vaporized out of their storage vessels by bubbling an inert gas, such as nitrogen, helium, argon or hydrogen, through the storage vessel to entrain the precursor and the precursor and the carrier gas are delivered in the vapor state to the chemical vapor deposition zone or reactor. The aluminum and copper precursors can be premixed prior to delivery to the chemical vapor deposition zone or reactor.

The description of several typical CVD processes using DMEAAl and Cu(BDI)$_2$ follow. Both DMEAAl and Cu(BDI)$_2$ are synthesized according to published procedures.

1. LPCVD WITH GAS PHASE DELIVERY FROM TWO SOURCES

Deposition experiments are performed in a cold wall LPCVD reactor at a total pressure of 0.10–10 torr. The DMEAAl is stored in a stainless steel bubbler held at 10°–25° C. Carrier gas, either nitrogen, argon, or hydrogen, is bubbled through the DMEAAl at 20–200 sccm, transporting the DMEAAl to the reactor. Cu(BDI)$_2$ is stored in a second stainless steel bubbler held at 50°–150° C. Carrier gas, either nitrogen, argon, or hydrogen, is bubbled through the Cu(BDI)$_2$ at 20– 200 sccm, transporting the Cu(BDI)$_2$ to the reactor. The walls of the reactor are kept at a temperature equal to or higher than the bubbler temperature to prevent condensation of organometallic onto the reactor walls. The substrate to be coated is placed on a stainless steel susceptor inside the reactor and the susceptor and substrate were raised to the 150°–250° C. deposition temperature by means of a resistive heater imbedded in the susceptor. The temperature of the substrate is measured with a thermocouple which was in contact with the back of the substrate. Prior to deposition the reactor is evacuated to a base pressure of $10^6$ torr to minimize contamination of the growing film by adventitious water and oxygen. Using this procedure a chemically pure aluminum/(0.25–4.0%)copper film with small grain size, excellent compositional uniformity, good adhesion to the substrate, excellent electromigration resistance, and a smooth morphology can be formed.

2. LPCVD WITH DIRECT LIQUID INJECT OF DMEAAl AND GAS PHASE DELIVERY OF Cu(BDI)$_2$ FROM A SECOND SOURCE

Using the reactor described in example 1, DMEAAl is delivered using a direct liquid injector and vaporizer. Cu(BDI)$_2$ is stored in a stainless steel bubbler held at 50°–150° C. Carrier gas, either nitrogen, argon, or hydrogen, is bubbled through the Cu(BDI)$_2$ at 20–200 sccm, transporting the Cu(BDI)$_2$ to the reactor. Using the deposition parameters described in Example 1, a chemically pure aluminum/ (0.25–4.0%)copper film with small grain size, excellent compositional uniformity, good adhesion to the substrate, excellent electromigration resistance, and a smooth morphology can be formed.

3. LPCVD WITH DIRECT LIQUID INJECT OF A SOLUTION OF Cu(BDI)$_2$ IN DMEAAl

Using the reactor described in example 1. A 1% solution of Cu(BDI)$_2$ in DMEAAl is delivered using a direct liquid injector and vaporizer. Carrier gas, 20– 200 sccm of either nitrogen, argon, or hydrogen, is added to the reactor. Using the deposition parameters described in Example 1, a chemically pure aluminum/(0.25–4.0%)copper film with small grain size, excellent compositional uniformity, good adhesion to the substrate, excellent electromigration resistance,

4. PECVD WITH DIRECT LIQUID INJECT OF A SOLUTION OF Cu(BDI)₂ IN DMEAAl

Using the reactor described in example 1 which has been modified by addition of a parallel plate RF plasma operating at 13.56 MHz and a power of 10–100 watts. A 1% solution of Cu(BDI)₂ in DMEAAl is delivered using a direct liquid injector and vaporizer. Carrier gas, 20–200 sccm of either nitrogen, argon, or hydrogen, is added to the reactor. Using the deposition parameters described in Example 1, a chemically pure aluminum/(0.25–4.0%)copper film with small grain size, excellent compositional uniformity, good adhesion to the substrate, excellent electromigration resistance, and a smooth morphology is prepared.

The present invention demonstrates advantages over the prior art for depositing chemically pure conformational aluminum-copper films on substrates, such as the demanding requirements of metallization layers for semiconductor devices, by providing a high performance, simple, one-step method for simultaneously codepositing aluminum and copper under mild conditions using compatible aluminum and copper precursors. The one-step codeposition enhances process efficiencies, while using room temperature stable metal precursors that form excellent films or layers.

The scope of the present invention is set forth in the claims which follow.

We claim:

1. A method for the simultaneous codeposition of aluminum and copper on a substrate under chemical vapor deposition conditions to form a layer of aluminum and copper on said substrate, comprising the steps of:

(a) heating said substrate to a temperature in the range of approximately 150° to 250° C.;

(b) contacting said substrate at chemical vapor deposition conditions with a copper precursor of the formula:

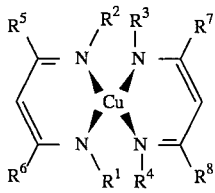

wherein $R^1$, $R^2$, $R^3$, $R^4$, $R^5$, $R^6$, $R^7$, $R^8$ are individually H, or $C_1$–$C_{10}$ hydrocarbon;

(c) simultaneously to step (b) contacting said substrate at chemical vapor deposition conditions with an aluminum precursor selected from the group consisting of:

$H_3AlN(R^9)(R^{10})(R^{11})$, where $R^9$, $R^{10}$ and $R^{11}$ are individually $C_1$–$C_4$ hydrocarbon and at least one of the R groups can be $CH_2CH_2N(CH_3)_2$, or $H_{(3-x)}Al(R^{12})_x$ where $R^{12}$ are individually $C_1$–$C_4$ hydrocarbon and x=1–3, or $Cl_{(3-x)}Al(R^{13})_x$ where $R^{13}$ are individually $C_1$–$C_4$ hydrocarbon and x=1–3;

(d) codepositing a layer of aluminum and copper on said substrate.

2. The method of claim 1 wherein $R^1$, $R^2$, $R^3$, $R^4$, $R^5$, $R^6$, $R^7$, $R^8$ are individually selected from the group consisting of H, $CH_3$, $CH_2CH_3$, $CH_2CH_2CH_3$, $CH(CH_3)_2$, $CH_2CH_2CH_2CH_3$, $CH_2CH(CH_3)_2$, $CH(CH_3)_3$, and Phenyl.

3. The method of claim 2 wherein said copper precursor has $R^5$, $R^6$, $R^7$, $R^8$ = methyl.

4. The method of claim 1 wherein said aluminum precursor is selected from the group consisting of trimethylaminealane, dimethylethylaminealane, N,N,N'N'-tetramethylethylene-1,2-diaminealane, dimethylaluminum hydride and mixtures thereof.

5. The method of claim 1 wherein said copper precursor is entrained in a carrier gas for contact with said substrate.

6. The method of claim 5 wherein said carrier gas is selected from the group consisting of nitrogen, helium, argon, hydrogen and mixtures thereof.

7. The method of claim 1 wherein said aluminum precursor is entrained in a carrier gas for contact with said substrate.

8. The method of claim 7 wherein said carrier gas is selected from the group consisting of nitrogen, helium, argon, hydrogen and mixtures thereof.

9. The method of claim 1 wherein said copper precursor is supplied in a liquid phase to a vaporization zone to vaporize said copper precursor before contact with said substrate.

10. The method of claim 1 wherein said aluminum precursor is supplied in a liquid phase to a vaporization zone to vaporize said aluminum precursor before contact with said substrate.

11. The method of claim 1 wherein said aluminum precursor and said copper precursor are mixed in the liquid phase and supplied to a vaporization zone to vaporize before contact with said substrate.

12. The method of claim 1 wherein said layer is aluminum/(0.25–4% copper).

13. The method of claim 1 wherein said chemical vapor deposition conditions are at a pressure of approximately 0.10–10 torr.

14. The method of claim 1 wherein said chemical vapor deposition conditions are at approximately atmospheric pressure.

15. The method of claim 1 wherein said chemical vapor deposition conditions are plasma enhanced by a radio frequency plasma operating at a range of approximately 100 KHz to 13.56 MHz.

\* \* \* \* \*